United States Patent [19]

Drye et al.

[11] Patent Number: 4,722,914
[45] Date of Patent: Feb. 2, 1988

[54] METHOD OF MAKING A HIGH DENSITY IC MODULE ASSEMBLY

[75] Inventors: James E. Drye, Mesa, Ariz.; Jack A. Schroeder, Austin, Tex.; Vern H. Winchell, II, Scottsdale, Ariz.

[73] Assignee: Motorola Inc., Schaumburg, Ill.

[21] Appl. No.: 896,356

[22] Filed: Aug. 13, 1986

Related U.S. Application Data

[62] Division of Ser. No. 615,499, May 30, 1984, Pat. No. 4,630,096.

[51] Int. Cl.⁴ .................. H01L 21/56; H01L 23/30
[52] U.S. Cl. ........................... 437/213; 29/740; 357/73; 156/644; 156/662; 174/52 PE; 437/982; 437/981
[58] Field of Search ................ 357/80, 81, 74, 69, 357/75; 29/589, 590, 591, 829, 837; 174/52 FP

[56] References Cited

U.S. PATENT DOCUMENTS

| 3,365,620 | 1/1968 | Buthek et al. | 357/80 |
| 3,757,175 | 1/1973 | Kim et al. | 357/80 |
| 3,777,221 | 12/1973 | Tatusko et al. | 361/401 |
| 4,189,825 | 2/1980 | Rolliard et al. | 29/574 |
| 4,445,952 | 5/1984 | Reynolds, III et al. | 29/829 |

FOREIGN PATENT DOCUMENTS 2425626 11/1975 Fed. Rep. of Germany.
2828044 7/1979 Fed. Rep. of Germany.
3233195 5/1982 Fed. Rep. of Germany.
53-46669 1/1978 Japan.

OTHER PUBLICATIONS

Ahearn and Beck, "Silicone Heat Sink Method to Control Integrated Circuit Chip Operating Temperatures", IBM Technical Disclosure Bulletin, vol. 21, No. 8, 1-79, pp. 3378-3390.

Primary Examiner—Brian E. Hearn
Assistant Examiner—Beverly A. Pawlikowski
Attorney, Agent, or Firm—Robert M. Handy

[57] ABSTRACT

An electronic module having a high density of silicon IC chips is provided by mounting the chips in tapered through-holes in a silicon substrate, filling the edge gaps between the chips and the substrate with a glass so that the chips, the filler glass, and the substrate have a smooth upper surface adapted to receive monolithic interconnections formed by planar metalization methods. The resulting assembly is enclosed in a housing also formed substantially from silicon, which contains electrically isolated pins for contacting the input-output electrodes of the assembly. Preferential etching is used to form the through-holes in the substrate as well as various alignment means on the substrate and other parts of the housing so that they are self-aligning during assembly. Improved performance, reliability, and low cost is obtained.

12 Claims, 20 Drawing Figures

METHOD OF MAKING A HIGH DENSITY IC MODULE ASSEMBLY

This is a division of application Ser. No. 615,499, filed May 30, 1984, U.S. Pat. No. 4,630,096.

BACKGROUND OF THE INVENTION

1. Field of the Invention

This invention relates in general to electronic circuit modules, and, more particularly, to improved means and methods for providing high density circuit assemblies and modules having a multiplicity of interconnected integrated circuit chips or other components.

2. Background Art

Modern fabrication techniques make it possible to pack very large numbers of high speed semiconductor devices into individual integrated circuit (IC) chips or die. However, in order to build functioning systems, the individual ICs must be electrically interconnected in some way. Historically this has been done by mounting the individual IC die in selected packages. These seal packages protect the die from the environment and provide rugged external leads or pads which can be used for interconnecting the ICs in the system. The packaged die are generally mounted by their leads on a circuit board which contains the interconnect wiring. The circuit board often has multiple layers of interconnect wiring and may be fabricated of metallized plastics, ceramics, or impregnated paper or fabric. A significant disadvantage of this method is that the wiring length from die to die, through the individual packages and along the conductors of the circuit board, is many times the size of the IC die. With very high speed devices, these compratively long wiring lengths cause significant propagation delays, reducing the overall system performance.

More recently, it has been possible to produce IC die which are themselves hermetically sealed so that they may be mounted directly on the circuit board or substrate rather than being housed in individual packages. The circuit board or assembly is then encapsulated as a whole to form a module. Omitting the individual packages permits the die to be closer together, thus reducing the propagation delay in the circuit board. While this provides some improvement, it does not completely solve the problem of excess propagation delay. Further, severe problems having to do with reliability and with removing heat still remain.

The IC die or chips have bonding pads which are connected to the wiring pattern on the circuit board by a variety of off-chip connection means; generally involving soldering or welding. Examples are wire bonds, flexible tapes, beam leads, and solder bumps. A significant difficult with these prior art approaches is that in most cases the metallurgy needed to make such off-chip connections is different than the metallurgy used for the on-chip interconnections within the IC chip. It is well known that the reliability of off-chip interconnections is substantially poorer than the reliability of on-chip interconnections. Further, these prior art off-chip connections utilize much more area on the circuit board or substrate than is desired. This contributes to the comparatively low packing density of prior art circuit modules, even when the individual die packages are omitted, and the continued significant propagation delays associated therewith.

Prior art modules have utilized materials having markedly different coefficients of thermal expansions. As a consequence thermal stresses are induced during temperature cycling. This further degrades reliability of the finished modules. Additionally, prior art modules have not provided simple and effective means for removal of heat from the many IC chips or other components within the module. Thus, a need continues to exist for improved modules for integrated circuits and other components, particularly high density modules, having improved packing density, propagation delay, heat dissipation, ease of manufacture, and cost.

Accordingly, it is an object of the present invention to provide an improved means and method for electronic modules for integrated circuits having a high packing density.

It is a further object of the present invention to provide an improved means and method for electronic modules wherein the number of welded or soldered joints required to interconnect the IC chips or other components within the module is reduced.

It is an additional object of the present invention to provide an improved means and method for electronic modules wherein the generation of mechanical stress from temperature changes is reduced.

It is a further object of the present invention to provide an improved means and method for electronic modules wherein the materials used for the module comprise the same material as used for the integrated circuit chip.

It is an additional object of the present invention to provide an improved means and method for electronic modules wherein the principle elements of the module are self aligning for easy assembly.

It is a further object of the present invention to provide an improved means and method for electronic modules wherein the individual IC chips are mounted in a supporting member so as to have accessible rear faces adapted for contacting a planar heat sink, and exposed front faces which are smoothly joined to, and optimally, part of the interconnect wiring surface.

It is an additional object of the present invention to provide an arrangement for including semiconductor die prepared using different processing technologies (e.g. TTL, NMOS, linear, ECL, etc.) within the same monolithic substrate.

It is a further object of the present invention to provide a means and method for incorporating pretested die in a monolithic substrate which can be interconnected using planar metallization technology.

SUMMARY OF THE INVENTION

These and other objectives of the present invention are achieved by means of the invented structure in which the individual IC die are embedded in a support substrate so that their upper surfaces, on which the die connection points (e.g. contact pads) are located, are substantially co-planar with the surface of the substrate. The die are held by their edges. Any gaps between the substrate and the embedded die are filled so that the upper surface of the die, the upper surface of the gap filler material, and the upper surface of the substrate are substantially smooth and continuous. Conventional monolithic metallization techniques can be used to form the inter-chip wiring within the module. This inter-chip wiring interconnects the various IC die embedded in the substrate and couples them to the external connection points of the module. Where the surfaces of the IC chip are covered with an insulating passivation layer, as is usually the case, the inter-chip wiring may pass over as well as between the individual ICs. Hence, packing density is maximized and propagation delay minimized.

It is important that the substrate, the die, and the gap filling material have compatible thermal coefficients of expansion (TCEs), and it is desirable that they be similar. It is preferable that the same material be used for the substrate as is used for the semiconductor. Further, it is important that the surfaces on which the inter-chip wiring is placed be smooth, that is, free from sharp steps. Additionally, it is important that the rear faces of the die be co-planar and directly accessible to a heat sink plate, so that the escape of the heat generated within the die is not impeded by being required to pass through the substrate which supports the inter-chip wiring.

In a preferred embodiment using silicon semiconductor chips, the substrate is also formed from silicon and the chips are mounted by their edges in through-holes in the substrate, preferably using a glass having a compatible coefficient of expansion. The substrate contains alignment means which are indexed to a heat sink in contact with the rear faces of the die. The heat sink is in turn indexed by other alignment means to an external connection support plate containing an array of connection pins. It is desirable that the heat sink and the connection support plate have substantially the same coefficient of expansion as the substrate, and preferably comprise the same material as used for the active devices, for example, silicon. To form the module, the substrate with the embedded interconnected die, the heat sink, and the connection support plate are sealed together, preferably using a soldering material.

BRIEF DECSRIPTION OF THE DRAWINGS

FIGS. 8A-F are inverted with respect to FIG. 4B. FIG. 8G is the same as FIG. 8F, but oriented in the same manner as FIG. 4B.

DETAILED DESCRIPTION OF THE PREFERRED EMBODIMENT

Figure 1:
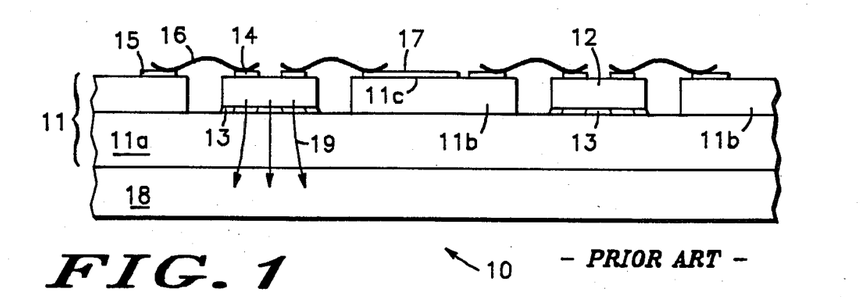
FIG. 1 shows in schematic form, a cross-sectional view of a portion of a multi-chip integrated circuit electronic assembly or module according to the prior art.

FIG. 1 shows a schematic cross-sectional view of a portion of prior art IC assembly 10 comprising circuit board or substrate 11 having base portion 11a and wiring portion 11b. IC chips 12 are mounted face-up on base portion 11a by attachment means 13. IC chips 12 have bonding pads 14 which are connected by flexible wire or tape bonds 16 to corresponding pads 15 on interconnect wiring pattern 17 on surface 11c of wiring portion 11b of substrate 11. Heat is removed from IC chips 12 through attachment means 13 and substrate 11 to heat sink 18, as indicated by arrows 19.

This design suffers from at least three important disadvantages: (i) off-chip bonds 16 are less reliable than the on-chip or on-board wiring and are a significant failure mode, (ii) heat must be removed to heat sink 18 through attachment means 13 and substrate 11, thereby increasing the thermal impedance and reducing performance, and (iii) chip packing density is limited because inter-chip wiring can be located only on substrate wiring portion 11b.

Figure 2:
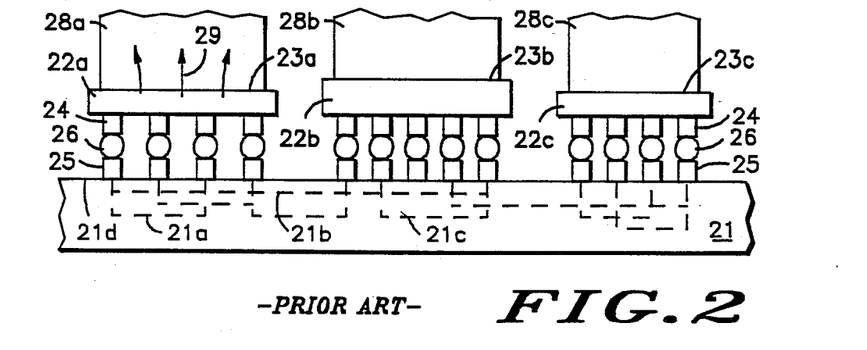
FIG. 2 shows in schematic form, a cross-sectional view of a portion of a multi-chip integrated circuit electronic assembly or module according to another embodiment of the prior art.

FIG. 2 shows a schematic cross-sectional view of a portion of prior art IC assembly 20 comprising circuit board or substrate 21 having buried wiring patterns indicated by dotted lines 21a-c which tie together bonding pads 25 on surface 21d of substrate 21. IC die 22a-c are mounted face-down onto substrate 21 by means of solder bumps 26 which connect bonding pads 24 on die 22a-c to pads 25 on substrate 21. Pads 24 and 25 are arranged so that they align. Heat is removed from rear surfaces 23a-c of die 22a-c directly to heat sinks 28a-c, as illustrated by arrows 29.

While this design is better than that of FIG. 1, it still suffers from several important disadvantages: (i) very large numbers of solder bump connections are required, since one is required for each contact point or bonding pad on each die (solder bump interconnections are susceptible to thermal stress cracking and are a significant source of failure, particularly in assemblies using ceramic or plastic substrates), (ii) comparatively large bonding pads are required on each die to accommodate the solder bumps, (iii) multilayer substrates, particularly laminated ceramic substrates, are expensive to fabricate, and (iv) variations in the height of rear surfaces 23a-c of individual die 22a-c above surface 21d of substrate 21 due, for example, to random die thickness variations, generally require that heat sinks 28a-c be articulated, that is, that thermal contact to each of die 22a-c be made individually, rather than by a single heat sink plate. In FIG. 2, die 22b is illustrated as being thicker than die 22a or 22c. Thus, heat sink 28b must be shorter than heat sinks 28a and 28c.

Figure 3:
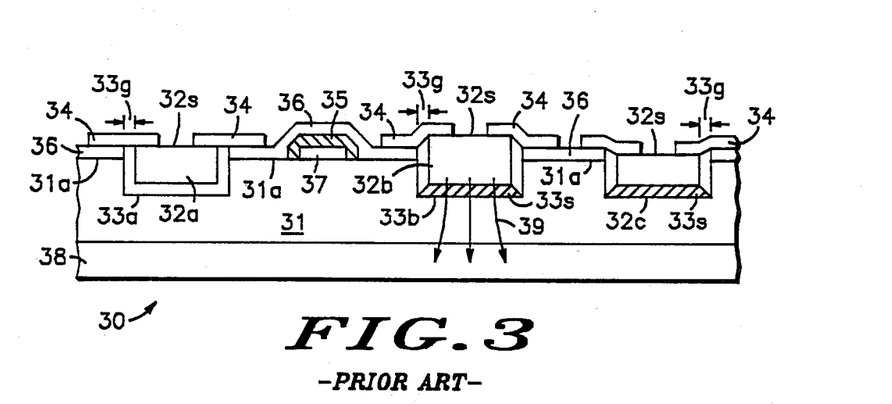
FIG. 3 shows in schematic form, a cross-sectional view of a portion of a multi-chip integrated circuit electronic assembly or module according to a further embodiment of the prior art.

FIG. 3 shows a schematic cross-sectional view of IC assembly 30, according to the prior art, in which die 32a-c are inset in cavities 33a-c in substrate 31. Die 32a-c are provided with beam leads 34 which bridge empty gaps 33g between die 32a-c and substrate 31. Beam leads 34 are welded or soldered to off-chip interconnect leads 36 or 37 on substrate 31. Leads 36 and 37 are separated by insulator 35 so that lead 36 can cross over lead 37 as needs be.

Die 32a-c may be supported entirely by beam leads 34, as is indicated for die 32a in cavity 33a at the left of FIG. 3, or be attached to substrate 31 by solder means 33s at the bottom of the cavity, as indicated for die 32b-c in cavities 33b-c, at the right of FIG. 3. Frequently, surfaces 32s of die 32a-c will be at a slightly different elevation than surface 31a of substrate 31. Beam leads 34, however, are deformable and can bend. Thus, differences in elevation of surfaces 31a and 32s can be accommodated, as is illustrated for die 32b and 32c. This permits die of different thickness to be placed in cavities of the same depth. FIG. 3 illustrates the situation where die 32a, die 32b, and die 32c all have different thicknesses.

The structure of FIG. 3 suffers from several disadvantages. Chief among these are that beam leaded IC chips are very expensive to fabricate and assemble. Beam leads also require the use of metallurgy for the beams (e.g. Au) which is different than the metallurgy (e.g. Al) in most common use for on-chip wiring of integrated circuits. When different metallurgies are joined there is a greater likelihood of reliability problems. Hence when beam leads are used, the choice of interconnect materials available to the designer is more limited than when beam leads are not used. Further, beams leads 34 must be larger than normal metallization runs and so are wasteful of die and substrate area. In addition, heat can be conductively removed from die 32b-c only through solder means 33s and substrate 31, as illustrated by arrows 39 leading from die 32b through supporting substrate 31 to heat sink plate 38. Heat can be conductivity removed from die 32a only through beam leads 34, since die 32a makes no other contact with substrate 31. This results in a higher junction temperature for a given power dissipation level and reduces the reliability of the module.

Figure 4A:
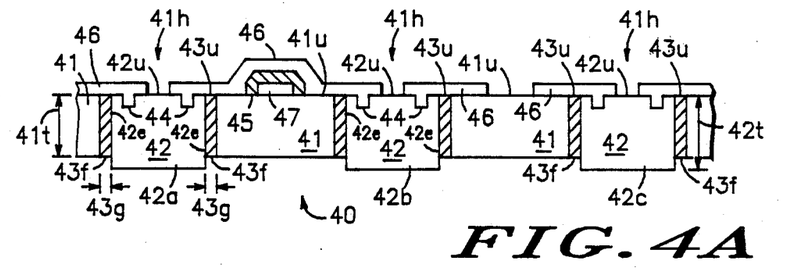
FIGS. 4A-B show in schematic form, cross-sectional views of a portion of a multi-chip integrated circuit electronic assembly or module, according to the present invention, and having IC chips of different thickness relative to the supporting substrate.
Figure 4B:
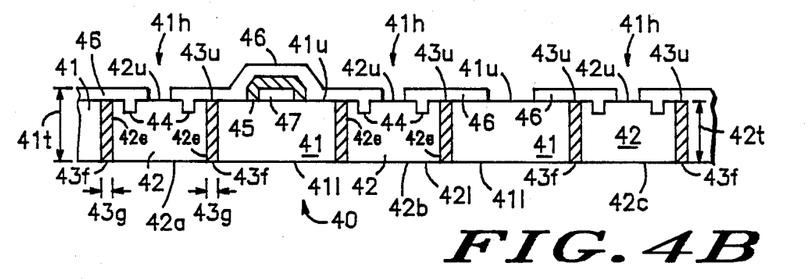

These and other limitations of the prior art systems can be avoided by use of the present invention. FIGS. 4A-B show cross-sectional views of a portion of monolithic IC assembly 40, according to a first embodiment of the present invention. Substrate 41 of monolithic assembly 40 contains through-holes 41h in which die 42 are held by their edges 42e by means of filler material 43f located in gaps 43g. Upper surfaces 42u of die 42, upper surface 41u of substrate 41, and upper surface 43u of gap filler material 43f are smoothly joined. Upper surface 42u of die 42 contains contact points 44 for making connection to the internal (on-chip) wiring of IC chip or die 42. Upper surface 41u of substrate 41 provides a smooth surface for supporting planar interconnect leads 46 and 47. Leads 46 and 47 differ in that lead 46 crosses over lead 47 by means of insulator 45. During fabrication, lead 47 is formed first. Cross-overs permit greater interconnection flexibility and are well known in the art.

By having upper surface 43u of gap filler material 43f smoothly join surfaces 41u and 42u, leads 46 and 47 can be formed by planar metallization techniques and extend from substrate surface 41u across gap filler surface 43u onto surface 42u of chip 42 to make contact directly to on-chip wiring contact points 44 of chips 42. This eliminates the need for wire bonds, beam leads, solder bumps, lead frames, and the like, as have been used in the prior art. There need be no welded or soldered connections between leads 46 and 47 on substrate 41, and connection points 44 on die 42, since intimate contact is made during the process by which leads 46 and 47 are fabricated. Planar metallization fabrication techniques are well known in the art and commonly used to provide interconnections within monolithic integrated circuits. As used herein, the words monolithic interconnections are intended to refer to interconnection made by planar metallization techniques. As used herein, the word monolithic refers to a continuous rigid body without voids or crevices.

Figure 4C:
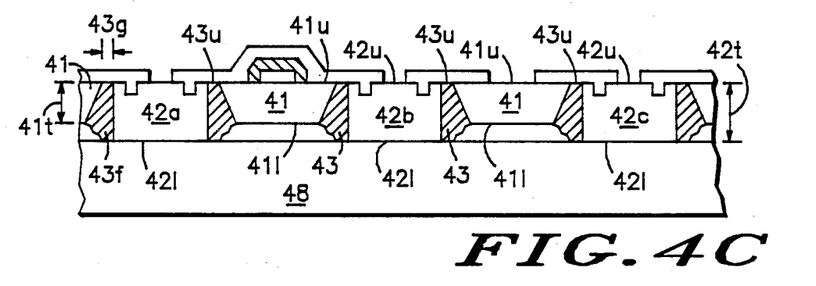
FIGS. 4C-D show portions of modules similar to FIGS. 4A-B, but according to a different embodiment and with a heat sink attached.
Figure 4D:
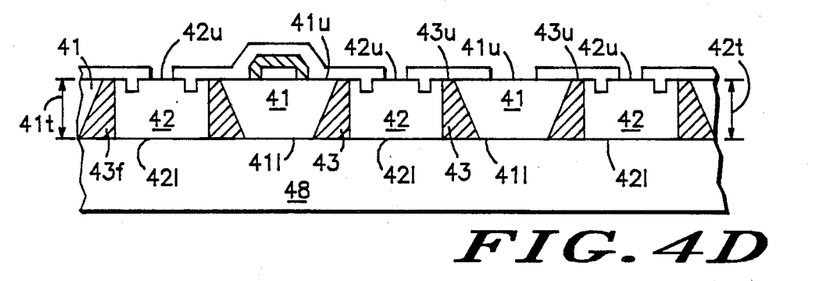

It is important that die 42 all have similar thickness 42t so that planar heat sink 48 may make intimate contact to die 42 without any need for articulation or for separate heat sinks for the individual die (see FIGS. 4C-D). As will be presently shown, this is readily obtained with the means and method of the present invention. Die 42 may be initially thinner than substrate 41. Substrate 41 is then lapped until substrate thickness 41t equals die thickness 42t. In the finished assembly, thickness 42t of die 42 must be at least equal to thickness 41t of substrate 41 so that die 42 may contact heat sink 48 without inteference from substrate 41.

FIGS. 4A and 4C illustrate the situation where some of die 42, e.g. die 42a-c, have thickness greater than the thickness of substrate 41, and FIGS. 4B and 4D illustrate the situation when die 42 have thickness equal to the thickness of substrate 41. In FIGS. 4B and 4D lower faces 42L and 41L as well as upper faces 42u and 41u of die 42 and substrate 41, respectively, are substantially coplanar. As shown in FIGS. 4C-D, there is direct contact between heatsink 48 and die 42, so that heat removal is particularly efficient. Where thickness 42t exceeds thickness 41t, a space can exist between substrate surface 41L and heat sink 48. This space may be empty, as shown in FIG. 4C, or filed, desirably with a heat conductive material.

It should be noted that die 42 are held in substrate 41 only by their edges 42e. Gap filler material 43f, as for example a glass, mechanically joins die 42 to substrate 41. Gap 43g can be quite narrow, as for example, 1 mil (0.025 mm) or less. This permits gap filler material 43f to be quite thin (see FIGS. 4A-B). A suitable material for use as gap filler material 43f when die 42 are of silicon is type CF-6 glass manufactured by Nippon Electric Glass Co., Osaka, Japan, to which is added 10 to 20 volume percent of 2 to 10 micron particle size silicon dioxide. This glass mixture has a coefficient of thermal expansion, for 15% volume percent $SiO_2$, of $39 \times 10^{-7}$ per °C., in the range 25° to 300° C. Other glasses having coefficients of thermal expansion in the range 30 to $45 \times 10^{-7}$ per °C., and otherwise compatible with die 42 are also suitable. Plastic materials can also be used provided that they have adequate thermal stability to withstand subsequent processing steps and do not introduce significant mechanical stress.

It is also important that gap filler material 43f not shrink or crack during curing or firing so as to produce crevies in upper surface 43u or at the interfaces where gap filler material 43f joins die 42 and substrate 41. If die 42 are other than silicon, then filler material 43f should be chosen to have a coefficient of thermal expansion which is also compatible with the material comprising die 42. Generally, the relative thermal coefficients of expansion of substrate 41, die 42, and filler material 43f should be arranged so that filler material 43f is in compression.

FIGS. 4A-B illustrate the situation where through-holes 41h have vertical side walls, i.e. substantially perpendicular to surface 41u. FIGS. 4C-D illustrate the situation where through-holes 41h have tapered side walls. The use of tapered through-holes is preferred. It is desirable that tapered through holes be narrower near upper surface 41u. Such tapered holes are readily obtained using selective etching along preferred crystallographic planes. The use of tapered holes facilitates placement of die 42 in the through-holes.

Contact points 44 on die 42 are interconnected by means of metallization runs or leads 46 and 47. Where cross-overs must occur, as for example between leads 46 and 47, insulating layer 45 is provided. Surfaces 42u, 41u, and 43u should be smooth, that is, there should not be abrupt steps in surface topology. As used herein, an abrupt step is defined as a change in surface topography or height greater than about 10% of the thickness of the layer intended to cover the step which occurs over a lateral distance less than the layer thickness.

It is desirable but not essential that surfaces 41u, 42u, and 43u be substantially co-planar. When surfaces 41u, 42u, and 43u are substantially coplanar, the surface topology does not contain large height differences which must be accommodated over short distances, and so abrupt surface steps are less likely. Surface smoothness is more important than absolute flatness or coplanarity. If surfaces 41u, 42u, and 43u join smoothly, i.e. without abrupt steps, then height differences of many times the thicknesses of the interconnect layers are easily accommodated.

Figures 5, 6B:
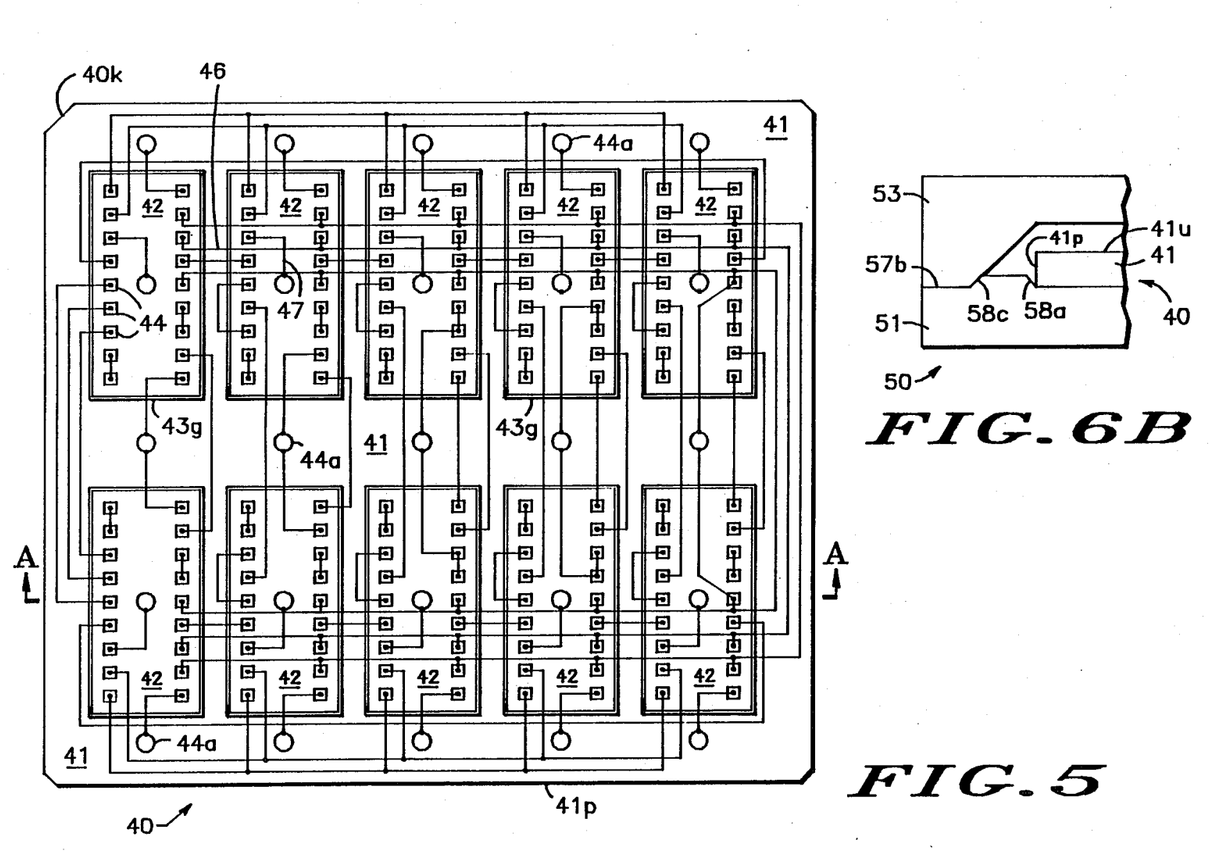
FIG. 5 shows a top view of a portion of an electronic module according to the present invention.
FIGS. 6B-C show portions of the module of FIG. 6A according to further embodiments.

FIG. 5 shows a top view of an example of an assembly or module according to a preferred embodiment of the present invention. Monolithic assembly 40 contains a multiplicity of die 42 mounted in substrate 41 and having interconnections 46 and 47 tying on-chip contact points 44 of die 42 to each other and to external connection points 44a. For clarity, insulating layer 45 between crossing metallization runs has been omitted and interconnect leads 46 and 47 are shown in schematic form. External connection points 44a are provided for connection of monolithic assembly 40 to the external system. External connection points 44a can overlie any portion of monolithic assembly 40, that is, they may be located on die 42, substrate 41, or gaps 43g.

FIG. 5 illustrates the situation when monolithic assembly 40 contains ten die 42, each of which has eighteen contact points 44, for a total of one hundred and eighty die contact points. These one hundred and eighty die contact points 44 are interconnected by monolithic leads 46 and 47 which run across substrate 41, die 42, and filled gaps 43g. Interconnect leads 46 and 47, in this example, also couple die 42 to twenty five external connection points 44a. Thus, FIG. 5 illustrates an assembly in which the number of welded or soldered joints required to interconnect the ten IC die to the external system has been reduced by the ratio (180−25)/180=86%. For more complex IC chips having a larger number of die contact points, the reduction in the number of joints can be much larger.

Figure 6A:
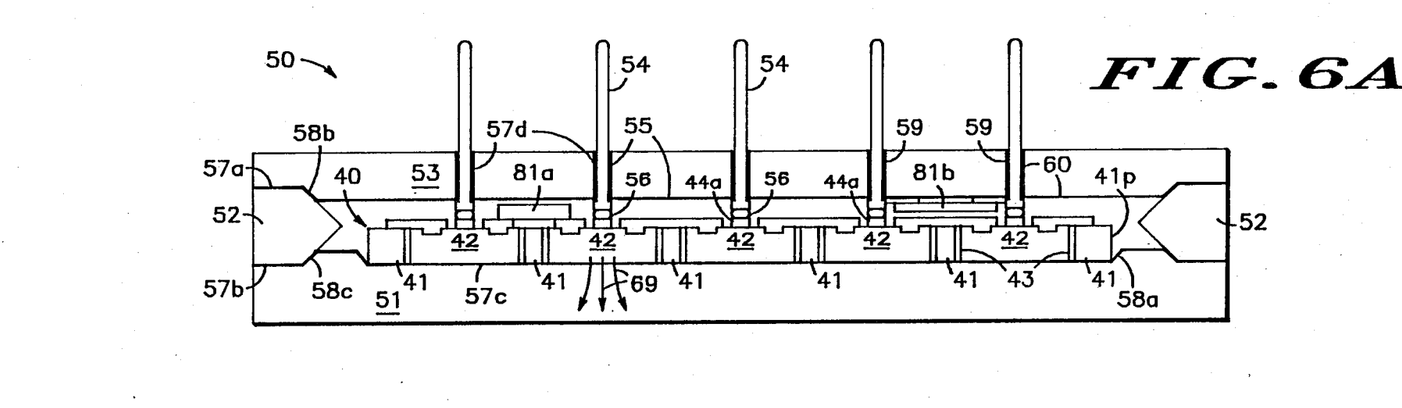
FIG. 6A shows in simplified form, a cross-sectional view of an electronic module according to the present invention, including a housing.
Figure 6C:
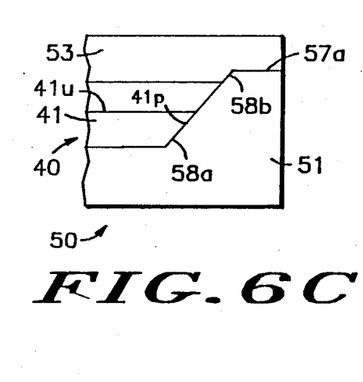
Figure 6D:
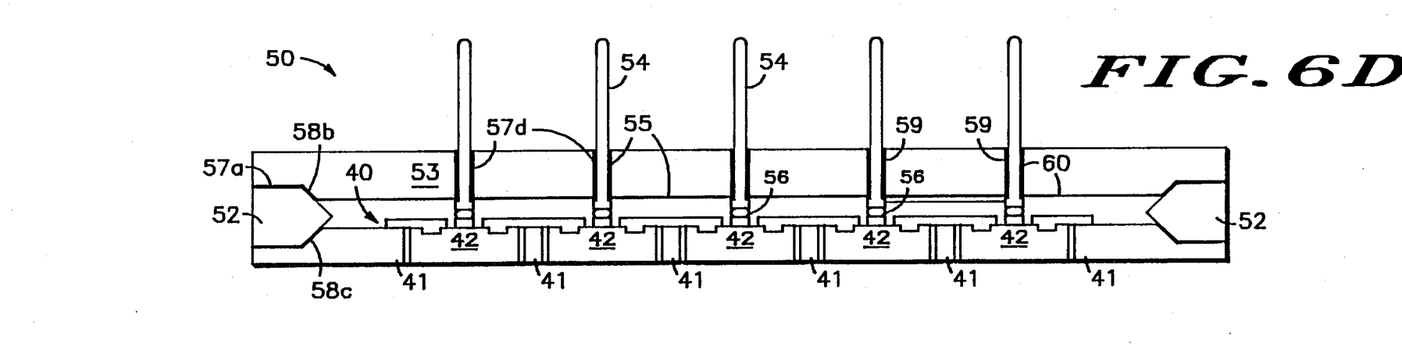
FIG. 6D shows in simplified form, a cross-sectional view of an electronic module according to a further embodiment of the present invention.

FIGS. 6A–C show cross sections of IC enclosure or module 50 made according to the teachings of this invention. Module 50 includes monolithic IC assembly 40. For clarity, most of the details of assembly 40, such as have been discussed in connection with FIGS. 4A–B and 5, have been omitted. External connection points 44a are shown. FIGS. 6B–C show portions of alternative arrangements, in less detail, of the periphery of module 50 of FIG. 6A. FIG. 6D shows an alternative arrangement in which assembly 40 forms an external wall of module 50 so as to provide for improved heat transfer to the external cooling means.

Assembly 40 is placed within enclosure 50 which preferably comprises heat sink 51, seal ring 52, and connection substrate 53, having therein connection pins 54. Heat sink 51 of FIGS. 6A–C and 7 is analogous to heat sink 48 of FIGS. 4C–D. In a preferred embodiment wherein die 42 are from silicon, it is preferable that heat sink 51, seal ring 52, and connection substrate 53 also be of silicon. Pins 54 are insulated from connection substrate 53 by means of insulating layer 55, for example of silicon oxide. Connection means 56, for example solder bumps, allow output connection points 44a on IC assembly 40 to be coupled to output pins 54. Connection means 56 are in contact with connection points 44a which are coupled to leads 46 and 47. The direct thermal path from die 42 to heat sink 51 provides improved thermal coupling to the external cooling means as compared to the prior art arrangements, as indicated by arrows 69.

Assembly 40, heat sink 51, and connection substrate 53 contain alignment keys so that when they are assembled, external connection pins 54 in connection substrate 53 line up with connection points 44a on assembly 40. This is facilitated by use of intermediate seal ring 52 which joins heat sink 51 at interface 57b and connection substrate 53 at interface 57a. Intermediate seal ring 52 is desirable but not essential, since, for example, connection substrate 53 can be shaped so as to mate directly with heat sink 51 on alignment surface 58c and interface 57b (see FIG. 6B). Alternatively, heat sink 51 can be shaped to mate directly with connection substrate 53 at interface 57a and alignment surface 58b (see FIG. 6C). Further, while heat sink 51 is desirable for increased strength, it is not essential and may be omitted, in which case substrate 41 of assembly 40 is extended to join directly to seal ring 52 and/or connection substrate 53. This is illustrated in FIG. 6D.

Figure 7:
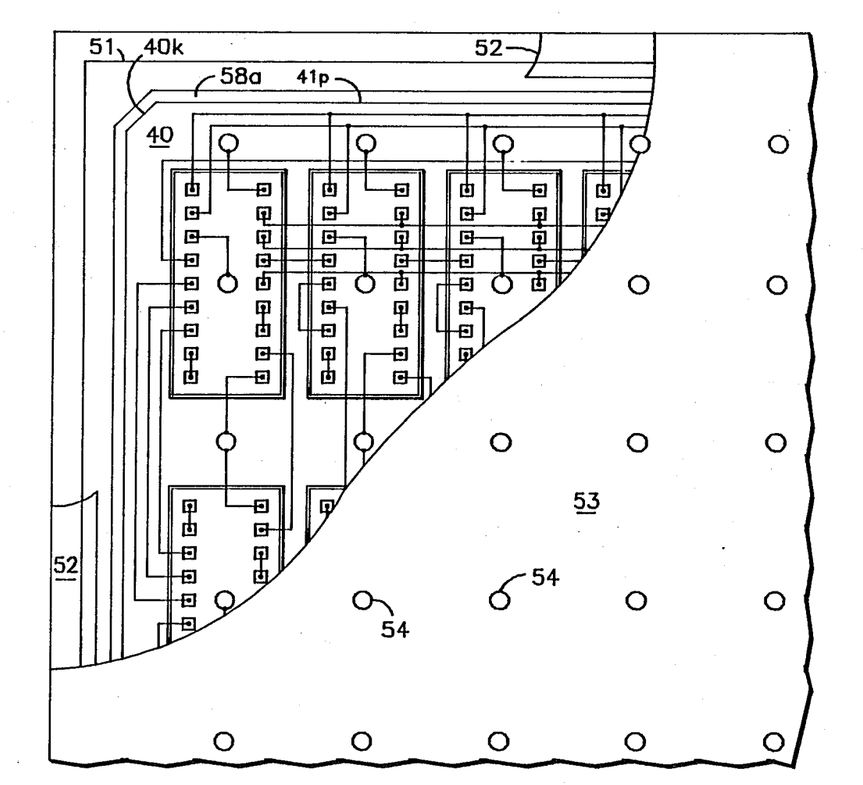
FIG. 7 shows, in simplified form, a pin-side-up partial cut-away view of the module of FIG. 6A.

The arrangement of the above-described parts can be more clearly seen in FIG. 7 which shows a pin-side-up partial cut-away view of module 50. Assembly 40 has perimeter 41p which matches surface 58a of heat sink 51, so that assembly 40 is laterally positioned in a predetermined location with respect to surface 58c (see FIG. 6A) which contact seal ring 52. Alignment key 40k (see FIG. 7) provides azimuthal orientation of assembly 40 in heat sink 51. Perimeter 41p and alignment surfaces 58a–c are conveniently formed using known photolithographic masking techniques in conjunction with anisotropic etching. It is preferred to use anisotropic etching which takes advantage of the property of crystalline materials such as silicon to etch along determinable crystallographic planes. Surfaces 58a–c are conveniently such determinable crystallographic planes. Connection pins 54 are located in known positions in connection substrate 53 by forming holes 59 for pins 54 and reference surface 58b in connection substrate 53 using photolithographic masking and etching techniques. Photolithographic masking and etching techniques are capable of great precision so that precise alignment of the elements of module 50 may be conveniently obtained. Key 40k may be formed by any convenient means.

Heat sink 51, and connection substrate 53 are conveniently joined to seal ring 52 by means of glass or metal seal means at interfaces 57a–b. Glass and or metal seal means can also be conveniently used at interface 57c between assembly 40 and heat sink 51, and at interface 57d between pins 54 and connection substrate 53. Techniques for joining semiconductors to each other and to other materials by use of glass and/or metal sealing or soldering are well known in the art. It is desirable that the sealing means used at interfaces 57a–d be compatible, that is, not introduce significant mechanical stress into the assembly. This is accomplished by choosing sealing and/or soldering materials which have coefficients of thermal expansion which are as close as practicable to the material used for enclosure 50.

Additional interconnection patterns may be placed on connection substrate 53 or assembly 40, and additional components may be mounted thereon if desired. For example, chip capacitors 81a–b can be mounted on connection substrate 53 and/or substrate 40 (see FIG. 6A).

EXAMPLE I

The following is an example of the practice of the method of the present invention for constructing an assembly such as has been described in connection with FIGS. 4A–B and 5. It is assumed in this example that die 42 are silicon ICs and that substrate 41 is of silicon. Those of skill in the art will understand that the described method applies to other materials and devices as well.

Substrate 41 is fabricated from a silicon starting wafer and then combined with die 42 to obtain monolithic assembly 40. As used herein, the terms "upper surface" or "top surface" are intended to refer to surfaces 41u, 42u, and 43u of substrate 41, die 42, and gap filler material 43f, respectively, and on which are located contact points 44 and 44a, and interconnects 46 and 47. The terms "lower surface" or "bottom surface" are intended to refer to the major surface opposite the upper or top surface, for example, surface 42L of die 42 and surface 41L of substrate 41. Assembly 40 is fabricated as follows.

(1) A silicon wafer is provided to be fabricated into substrate 41. A mask is applied to the upper surface of this silicon wafer to delineate through-hole areas on the wafer whose location corresponds to the desired location of die 42 in substrate 41, and whose shape and size correspond to the shape and size of die 42. The mask openings will generally be of a slightly different size than the desired through-holes to take into account any under-cut or over-etching inherent in the hole forming process or to make use of preferential etching along particular crystallographic planes. Adjustment of mask layer dimensions to account for etching under-cut or over-etching, or to account for preferential etching along crystallographic planes, is well known in the art. It is convenient to use a silicon wafer that has been already coated with a refractory dielectric insulating layer, e.g. silicon dioxide and/or silicon nitride. It is desirable that the mask also delineate outer perimeter 41p of substrate 41.

(2) Through-holes 41h are formed in substrate 41, preferably by etching or milling the silicon wafer through the mask of step (1) to obtain holes 41h extending through the silicon wafer. The hole forming step may include forming the perimeter of substrate 41 so as to separate substrate 41 from the balance of the silicon wafer, although this can be performed anytime prior to placing assembly 40 in module 50. It is preferable to separate assembly 40 from the starting wafer after mounting and interconnection of the IC die.

Selective etching or milling which differentiates between different cyrstallographic orientations is a preferred fabrication technique for assembly 40 since it produces precise geometric shapes whose size can be carefully controlled. This is especially helpful in etching through-holes 41h to accommodate rectangular die and in providing alignment keys having precisely controlled dimensions for subsequent installation of assembly 40 in an enclosure or housing. Techniques for selective etching of silicon and other crystalline materials are well known in the art. See for example, K. E. Petersen, "Silicon as a Mechanical Material," *Proceedings of the IEEE*, Vol. 70, No. 5, May 1982, pages 420–457. Other etching or milling techniques can also be used. Where the etching or milling step produces tapered holes, it is desirable that the narrower opening be adjacent to upper surface 41u of substrate 41, such as is shown in FIGS. 4C–D. This provides the smallest distance of gap filler material 43f between die 42 and substrate 41 to be crossed by planar metallization leads 46 and 47. Outer perimeter 41p of substrate 41 may be formed approximately perpendicular to surface 41u, as shown in FIG. 6B, or may be formed to match the angle of surface 58a of heat sink 51, as shown in FIG. 6C, or may be shaped as illustrated in FIG. 6D.

(3) Any sharp corners and edges in through-holes 41h are removed, preferably by isotropic etching. It is believed that sharp corners and edges in through-holes 41h cause mechanical stress concentrations and substrate cracking. Only a slight etching is required. For example, where substrate 41 is of silicon, a 45 to 90 second dip in a mixture of 14.4% hydrofluoric acid plus 71.3% nitric acid plus 14.3% acetic acid, is generally adequate to remove the sharp corners and edges of anisotropically etched tapered through-holes. The precise time depends upon the wafer thickness and etchant temperature and is readily determined by experiment.

Through-holes 41h must have dimensions slightly exceeding the dimensions of die 42 to allow for insertion clearance. This insertion clearance corresponds to gap 43g. For die 42 of dimensions 157 by 323 mils (4.0 by 8.2 mm), it was found that with gap 43g of about 1 mil (0.025 mm), insertion could be conveniently accomplished and gap 43g filled by material 43f to have smooth upper surface 43u. Generally, gap 43g should be in the range 0.5 to 1.5 mils (0.013 to 0.038 mm), with 0.8 to 1.2 mils (0.02 to 0.03 mm) being preferred.

The size of through-holes 41h and gap 43g is determined by the combined action of masking step (1), hole forming step (2), and corner and edge blunting step (3). It was found, for example, that through-holes 41h formed using anisotropic etching in step (2), increased in lateral dimensions by about 3.5 mils (0.089 mm) in width and length during isotropic etching in step (3), e.g. from about 155.5×321.5 to about 159×325 mils, after a 55 second dip etch at 45° C. Adjustment of masking and etching or milling steps to achieve final target dimensions of a particular size is generally well known in the art.

(4) The silicon wafer and/or substrate 41 is coated with an insulating layer, e.g. silicon oxide, at least along the sides of through-holes 41h. This coating step may also include coating the upper surface of the silicon wafer or substrate 41. Where substrate 41 is conductive, an insulating layer must be formed on upper surface 41u of substrate 41 prior to step (10) so as to insulate leads 46–47 from substrate 41.

Figure 8A:
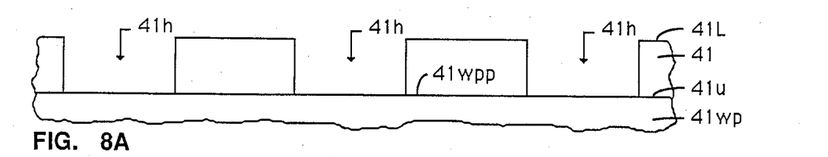
FIGS. 8A-G show in schematic form, simplified cross-sectional views of the assembly of FIG. 4B but during different stages of fabrication.

(5) The wafer and/or substrate 41 is placed with upper surface 41u against 41wp flat plate (See FIG. 8A). This flat plate (See FIG. 8A) is referred to as a witness plate.

Figure 8B:
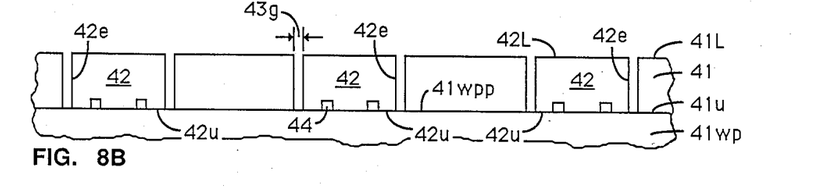

(6) Die 42 are placed in etched through-holes 41h with upper surfaces 42u against witness plate 41wp (see FIG. 8B).

Figure 8C:
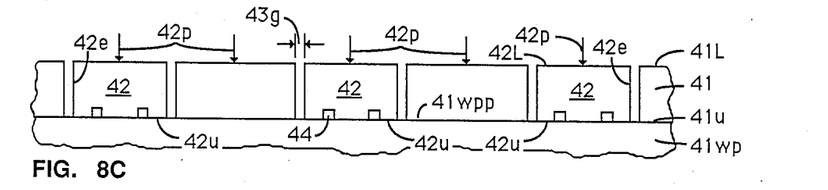

(7) The wafer and/or substrate 41 and die 42 are pressed against witness plate 41wp (see 42p of FIG. 8C-D) to prevent encroachment of gap filling material 43f onto upper surfaces 42u of die 42 and upper surface 41u of substrate 41. Witness plate 41wp provides reference plane 41wpp which is substantially co-planar with upper surfaces 42u of die 42 and 41u of substrate 41, and against which upper surface 43u of gap filler material 43f is formed (see FIG. 8D).

Figure 8D:
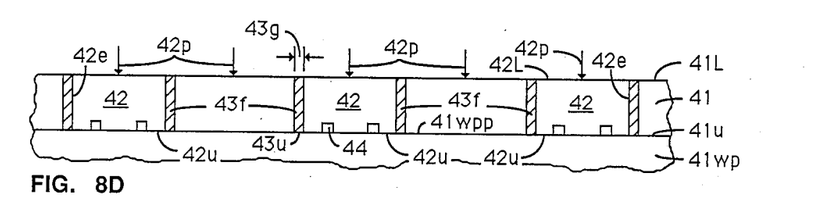

(8) Gap filling material 43f is applied in gaps 43g between die 42, substrate 41, and witness plate 41wp (See FIG. 8D). Type CF-6 glass with 15 volume percent $SiO_2$, as described earlier, is usful for gap filling material 43f, but other materials with appropriate coefficients of thermal expansion can also be used. It is desirable to strike-off any excess glass so that it does not coat the lower surfaces of die 42, but this is not essential (see FIG. 8E).

Figure 8E:
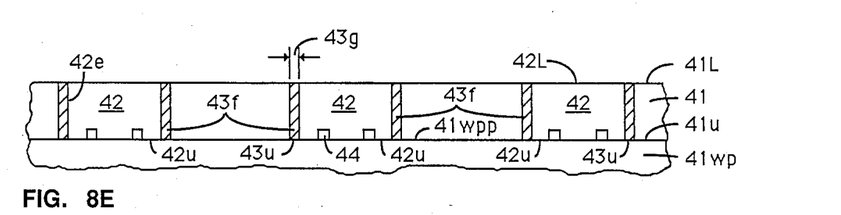
Figure 8F:
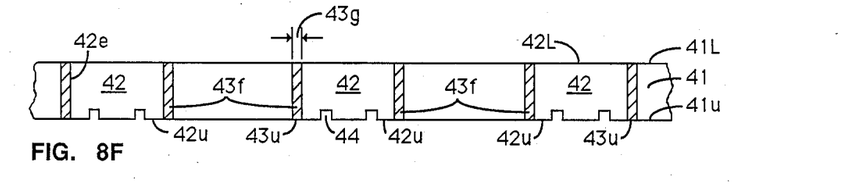
Figure 8G:
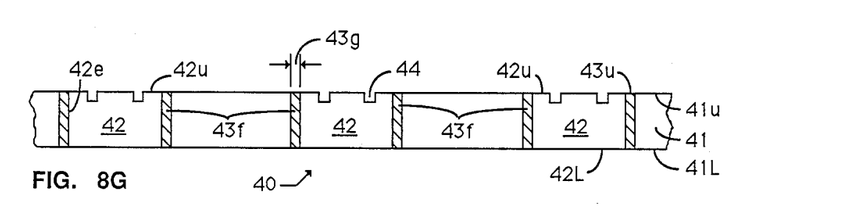

(9) Gap filling material 43f is fired or cured to attach die 42 to substrate 41 by edges 42e so that monolithic substrate-die assembly 40 can be obtained, and to provide smooth unbroken upper surface 43u bridging between die 42 and substrate 41 (see FIGS. 8E-G).

(10) One or more metallization layers 46 and/or 47 and any intervening insulating layers 45 are applied to the upper surface of substrate-die assembly 40 (FIG. 8G) to interconnect contact points 44 of die 42 and provide external connection points or pads 44a for external connection of assembly 40 (see FIG. 4B). Conventional planar IC metal deposition and patterning techniques are convenient for forming off-chip interconnections 46-47. Al, Au, Ti-W, and other commonly used interconnect metallization materials are suitable. Semi-metals and semiconductors may also be used. Techniques for forming and patterning such materials are well known in the art. For the off-chip interconnections, it is preferred to use the same materials and methods as used for the monolithic on-chip interconnections. This minimizes the number of different metallury systems and processes involved in assembly 40.

(11) If die 42 have unequal thickness or are thinner or thicker than substrate 41, the lower surfaces of die 42 and/or substrate 41 and gap filler material 43f of assembly 40 are lapped until the lower faces of die 42 are coplanar so as to be able to mate with non-articulated heat sink 48. This is especially useful since variations in die and/or substrate thickness are to be expected.

(12) Where isolation of die 42 from heat sink 48 is desired, the lower faces of die 42 or the upper surface of heat sink 48 are optionally coated with a thin insulating layer, for example, silicon oxide. Other insulating layers may also be used. It is desirable that they adhere strongly.

EXAMPLE II

The following is an example of the practice of the present invention according to another embodiment in which monolithic assembly 40 is utilized in conjunction with a mating housing to form encapsulated module 50. For convenience, this example is described for the situation where die 42 and substrate 41 are silicon. Those of skill in the art will understand that other compatible materials can also be used.

(1) Monolithic assembly 40 is provided, as decribed in connection with Example I, above. It is convenient that assembly 40 have perimeter 41p which has a predetermined size and shape, including the provision of one or more alignment keys or surfaces, such as are illustrated in FIGS. 5, 6A-D, and 7. After external connection points 44a have been formed, solder bumps 56 may be formed thereon. This may be done before or after assembly 40 is separated from the starting wafer of substrate 41. Methods for forming solder bumps are well known in the art. Alternatively, solder bumps may be formed directly on pins 54 and omitted from connection points 44a. Connection points 44a may have surface layers to facilitate joining by soldering.

(2) Connection substrate 53 is formed by masking and etching a silicon wafer to obtain through-holes 59 whose location corresponds to the locations of external contact points 44a on assembly 40. it is desirable that holes 59 have side walls which are substantially perpendicular to substrate 53. Techniques such as ultrasonic milling, ion milling, diamond abrasive drilling, or laser cutting may be used for forming holes 59.

Surface 58b in substrate 53 is formed, preferably using lithographic techniqes and aniotropic etching. It is desirable that both holes 59 and surface 58b be formed from a common mask so that there is no need for an intermediate alignment step. Regions having different etching requirements may be conveniently self-aligned using a master-mask technique, such as is described in U.S. Pat. No. 4,199,380. This insures that surface 58b and holes 59 are precisely located with respect to each other. It is desired that surfaces 60 in and about holes 59 where pins 54 are fixed to connection substrate 53 be insulated by forming thereon surface insulating layer 55 of, for example, silicon oxide or nitride. Alternatively, an insulating layer may be applied to those portions of pins 54 which contact substrate 53. Pins 54 are conveniently fixed in insulated holes 59 by soldering. A 80% gold—20% tin solder, manufactured by Cominco American Co., of Spokane, Washington is suitable.

Solder bumps 56 are readily provided on the heads of pins 54 by solder dipping or plating, and reheating, either before or after installation in substrate 53. The reheating step may be combined with the sealing of pins 54 into substrate 53. Providing solder bumps on pins 54 involves fewer processing steps than forming solder bumps on connection points 44a, as discussed in step (1) above, and is preferable.

(3) Heat sink 51 and seal ring 52 are formed by masking and etching in a manner similar to connection support plate 53. Lithography and anisotropic etching are conveniently used to provide flat surface 57c on heat sink 51 for interfacing to lower surface of assembly 40, and for forming surface 58a whose lateral dimensions match perimeter 41p of substrate 41 of assembly 40. Alignment surface 58c is formed at the same time and in the same manner as alignment surface 58a so that they are self-aligned.

Surfaces 58b and 58c of seal ring 52 are similarly formed so as to mate with heat sink 51 and connection substrate 53. In the case of seal ring 52, it is convenient to form surfaces 58b and 58c by anisotropic etching from each side of a silicon wafer which has been lapped to the thickness desired for seal ring 52.

(4) Sealing means is applied to interfaces 57a-c. Marz Indium foil manufactured by Materials Research Corporation, Orangeberg, N.Y., is a suitable sealing means. Heat sink 51, assembly 40, seal ring 52, and connection substrate 53 are assembled in a stacked relationship so that interconnection means 56 are in contact with connection points 44a. The assembled stack is then heated to fuse the sealing means to the several parts and fuse connect pins 54 to connection points 44a by means of solder bumps 56. It is desirable that this heating take place in vacuum or a controlled atmosphere.

The resulting module 50 is hermetic. Further, since the major structural components of module 50 can be substantially formed entirely from the same material, in this example silicon, the mechanical stress induced during assembly and by subsequent temperature excursions is very low. Further, the number of non-monolithic (e.g. soldered or welded) electrical connections in module 50 is much smaller than the number of monolithic connections to IC chips 42 mounted within the module. By reducing the number of non-monolithic electrical connections, the reliability is improved.

The present invention provides a means and method for electronic assemblies and modules which improves the packing density of IC chips and components, which permits chips made using different process technologies to be placed in a single monolithic substrate having a smooth surface, which reduces the number of non-monolithic electrical connections, which provides for more efficient removal of heat from the IC chips and components, which reduces the generation of mechanical stress, which utilizes self aligned assembly, which leave the rear faces of the IC die and components accessible for conductive heat removal, which avoids use of an articulated heat sink, which provides a hermetic module, which employs the same monolithic interconnection techniques for interconnecting the IC chips and components as are used on the components themselves, and which permits the major structural components of the module to be made, if desired, out of the same material as the semiconductor. These features result in improved performance, reliability, and cost.

We claim:

1. A method for forming an electronic structure, comprising:
   providing semiconductor die of a predetermined first lateral size, first thickness, and first material, and having contact points on an upper surface;
   providing a substrate of a second material and second thickness, and having an upper surface;
   forming through-holes in said substrate of a second lateral size larger than said first lateral size to accommodate said die;
   placing said upper surface of said substrate against a witness plate;
   placing said die in said through-holes with said upper surface of said die against said witness plate; and
   filling any gap between said die and said substrate with a filler material to hold said die in said through-holes by their edges.

2. The method of claim 1 wherein said filling step further comprises placing said filler material in contact with said witness plate to form an assembly with a smooth upper surface of said filler material connecting said upper surface of said die and said upper surface of said substrate.

3. The method of claim 2 further comprising interconnecting said contact points on said die using monolithic metallization means, and providing external connection points in said metallization means coupled to said contact points.

4. The method of claim 1 wherein said second material is a single crystal material and said forming step comprises forming tapered holes by preferential etching.

5. The method of claim 1 wherein said forming step further comprises isotropically etching said substrate after said through-holes are formed.

6. The method of claim 3 wherein said interconnecting step further comprises forming said monolithic metallization on said upper surfaces of said die, said filler material and said substrate.

7. A method for forming an electronic structure, comprising:
   providing semiconductor die of a predetermined first lateral size, first thickness, and first material, and having contact points on an upper surface;
   providing a substrate of a second material and second thickness, and having an upper surface;
   forming through-holes in said substrate of a second lateral size larger than said first lateral size to accommodate said die;
   placing said upper surface of said substrate against a witness plate;
   placing said die in said through-holes with said upper surface of said die against said witness plate;
   filling any gap between said die and said substrate with a filler material in contact with said witness plate to form an assembly with a smooth upper surface of said filler material connecting said upper surface of said die and said upper surface of said substrate to hold said die in said through-holes by their edges;
   interconnecting said contact points on said die using monolithic metallization means, and providing external connection points in said metallization means coupled to said contact points; and
   lapping the lower face of said assembly so that the lower faces of said die are substantially coplanar.

8. The method of claim 7 further comprising providing a first enclosure means to mate with said lower faces of said die, and having first alignment means for locating said substrate, providing a second enclosure means containing connection pins wherein each connection pin has therein connection means adapted to contact said external connection points on said monolithic metalization means, and providing in said second enclosure means second alignment means for locating said connection means in contct with said external connection points.

9. The method of claim 8 further comprising sealing said assembly, said first enclosure means, and said second enclosure means together.

10. The method of claim 8 wherein said step of providing said second enclosure means further comprises providing an alignment and sealing ring located between said first and second enclosure means for aligning said enclosure means during sealing.

11. The method of claim 8 further comprising sealing said assembly, said first enclosure means, said alignment and sealing ring, and said second enclosure means together.

12. A method for forming an electronic structure, comprising:
   providing semiconductor die of a predetermined first lateral size, first thickness, and first material, and having contact points on an upper surface;
   providing a substrate of a second material of substantially the same coefficient of expansion as said first material and of a second thickness, and having an upper surface;

forming through-holes in said substrate of a second lateral size larger than said first lateral size to accommodate said die;

placing said upper surface of said substrate against a witness plate;

placing said die in said through-holes with said upper surface of said die against said witness plate; and filling any gap between said die and said substrate with a filler material to hold said die in said through-holes by their edges.

* * * * *